(12) United States Patent
Buckley et al.

(10) Patent No.: US 12,550,399 B2
(45) Date of Patent: Feb. 10, 2026

(54) FIELD EFFECT TRANSISTOR WITH p-FET TYPE BEHAVIOUR

(71) Applicant: COMMISSARIAT À L'ENERGIE ATOMIQUE ET AUX ENERGIES ALTERNATIVES, Paris (FR)

(72) Inventors: Julien Buckley, Grenoble (FR); René Escoffier, Grenoble (FR); Cyrille Le Royer, Grenoble (FR); Blend Mohamad, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 331 days.

(21) Appl. No.: 18/363,242

(22) Filed: Aug. 1, 2023

(65) Prior Publication Data

US 2024/0162299 A1    May 16, 2024

(30) Foreign Application Priority Data

Aug. 1, 2022    (FR) ........................................ 2207976

(51) Int. Cl.
| | |
|---|---|
| *H01L 29/20* | (2006.01) |
| *H10D 30/47* | (2025.01) |
| *H10D 62/17* | (2025.01) |
| *H10D 62/85* | (2025.01) |
| *H10D 64/62* | (2025.01) |

(Continued)

(52) U.S. Cl.
CPC ......... *H10D 62/8503* (2025.01); *H10D 30/47* (2025.01); *H10D 62/343* (2025.01); *H10D 62/85* (2025.01); *H10D 64/62* (2025.01); *H10D 64/649* (2025.01); *H10D 84/01* (2025.01)

(58) Field of Classification Search
CPC .. H10D 62/8503; H10D 30/47; H10D 62/343; H10D 62/85; H10D 64/62; H10D 64/649; H10D 84/01; H10D 30/475; H10D 30/472; H10D 30/015; H10D 64/256; H10D 84/05; H10D 84/82; H10D 84/85
See application file for complete search history.

(56) References Cited

U.S. PATENT DOCUMENTS

| | | |
|---|---|---|
| 2013/0043485 A1 | 2/2013 | Ueno |
| 2014/0091310 A1 | 4/2014 | Jeon et al. |
| 2023/0170407 A1* | 6/2023 | Kawai .................. H10D 62/124 257/76 |

OTHER PUBLICATIONS

Search Report as issued in French Patent Application No. 2207976, dated Mar. 17, 2023.

(Continued)

*Primary Examiner* — Mohammed R Alam
(74) *Attorney, Agent, or Firm* — Pillsbury Winthrop Shaw Pittman LLP

(57) ABSTRACT

A field effect transistor includes a substrate; an electron channel layer disposed on the substrate; a barrier layer disposed on the electron channel layer; a hole channel layer disposed on the barrier layer; a p-type doped semiconductor material layer disposed on the hole channel layer; a source electrode including a first portion in ohmic contact with the electron channel layer and a second portion in ohmic contact with the p-type doped semiconductor material layer; a drain electrode in ohmic contact with the electron channel layer; and a gate electrode disposed facing the p-type doped semiconductor material layer, between the source and drain electrodes.

15 Claims, 8 Drawing Sheets

(51) Int. Cl.
*H10D 64/64* (2025.01)
*H10D 84/01* (2025.01)

(56) References Cited

OTHER PUBLICATIONS

Shankar, B., et al., "Safe Operating Area of Polarization Super-junction GaN HEMTs and Diodes," IEEE Transactions on Electron Devices, vol. 66, No. 10, Oct. 2019, XP011746751, pp. 4140-4147.
Raj, A., et al., "GaN/AlGaN superlattice based E-mode p-channel MESFinFET with regrown contacts and >50 mA/mm on-current," IEEE, (Year: 2021), 4 pages.
Zheng, Z., et al., "Gallium nitride-based complementary logic integrated circuits," nature electronics, vol. 4, Aug. 2021, pp. 595-603.
Chowdhury, N., et al., "Tungsten-Gated GaN/AlGaN p-FET With $I_{max}$ > 120 mA/mm on GaN-on-Si," IEEE Electron Device Letters, vol. 43, No. 4, Apr. 2022, pp. 545-548.

\* cited by examiner

FIELD EFFECT TRANSISTOR WITH p-FET TYPE BEHAVIOUR

CROSS-REFERENCE TO RELATED APPLICATIONS

This application claims priority to French Patent Application No. 2207976, filed Aug. 1, 2022, the entire content of which is incorporated herein by reference in its entirety.

TECHNICAL FIELD OF THE INVENTION

The technical field of the invention is that of power electronics. The present invention relates to a field effect transistor (or FET) based on III-N semiconductor materials such as gallium nitride (GaN).

TECHNOLOGICAL BACKGROUND OF THE INVENTION

The high electron mobility transistor (HEMT) is a field effect transistor that benefits from the conduction properties of a 2-Dimensional Electron Gas (2DEG). It comprises a vertical stack of III-N semiconductor layers on a substrate, typically made of silicon, silicon carbide or sapphire. The 2-dimensional electron gas is formed by a heterojunction between a channel layer, typically gallium nitride (GaN), and a barrier layer, typically aluminium gallium nitride (AlGaN).

The HEMT transistor holds high current densities in the on state, due to the high density of charge carriers and the high mobility of these carriers in the 2-dimensional electron gas. It can also have a high switching speed.

The HEMT transistor is an N-channel field effect transistor, commonly called an n-FET, that is, a transistor whose conduction is provided by electrons. To make logic circuits compatible with power applications, typically an inverter, this n-FET is associated with a P-channel field effect transistor, or p-FET, in other words a transistor whose conduction is provided by holes. The p-FET has to have similar performance to that of the n-FET, especially in terms of current, voltage withstand and switching speed.

FIG. 1 schematically represents a GaN inverter described in the document ["Gallium nitride-based complementary logic integrated circuits", Z. Zheng et al, Nature Electronics, Vol. 4, pp. 595-603, 2021]. This GaN inverter comprises an n-FET transistor 1a connected in series with a p-FET transistor 1b.

The n-FET transistor 1a is a conventional HEMT transistor especially comprising a silicon substrate 11, a GaN channel layer 12 disposed on the substrate 11, an AlGaN barrier layer 13 disposed on the channel layer 12 and a gate structure. The gate structure comprises a p-doped GaN layer 14 (p-GaN) and a gate electrode 15a in contact with the p-GaN layer 14 (so-called p-GaN gate). The n-FET transistor 1a furthermore comprises a drain electrode 16a and a source electrode 17a in ohmic contact with the 2-dimensional electron gas located in the immediate vicinity of the interface between the channel layer 12 and the barrier layer 13.

The p-FET transistor 1b comprises the same stack of semiconducting layers 11 to 14, a gate electrode 15b, a drain electrode 16b and a source electrode 17b. The p-GaN layer 14 forms a hole conduction layer which extends continuously between the drain electrode 16b and the source electrode 17b. The portion of the p-GaN layer 14 located under the gate 15b forms the channel region and is thinned so that it can be effectively (and electro-statically) controlled by the gate 15b. This portion is subjected to an oxygen plasma treatment to depopulate the channel region of holes (at thermal equilibrium) and impart a normally-off behaviour to the p-FET transistor.

Because of the low mobility of the holes in the p-GaN 14 layer (compared with that of the electrons in the 2DEG), the current density of the p-FET transistor 1b is about 100 times lower than that of the n-FET transistor 1a. To be able to hold the same current, the p-FET transistor 1b therefore has to have an active surface area around 100 times greater than that of the n-FET transistor 1a, which increases the cost of the inverter.

SUMMARY OF THE INVENTION

There is therefore a need to provide a field effect transistor having the behaviour of a p-FET transistor and a high current density, typically of the same order of magnitude as that of an n-FET transistor formed from the same semiconductor materials.

According to a first aspect of the invention, this need tends to be satisfied by providing a field effect transistor comprising:
  a substrate;
  an electron channel layer disposed on the substrate;
  a barrier layer disposed on the electron channel layer;
  a hole channel layer disposed on the barrier layer;
  a p-type doped semiconductor material layer disposed on the hole channel layer;
  a source electrode comprising a first portion in ohmic contact with the electron channel layer and a second portion in ohmic contact with the p-type doped semiconductor material layer;
  a drain electrode in ohmic contact with the electron channel layer;
  a gate electrode disposed facing the p-type doped semiconductor material layer, between the source and drain electrodes.

The ohmic contact between the second portion of the source electrode and the p-type doped semiconductor material layer allows free holes to be injected into the hole channel layer when a negative voltage is applied between the gate electrode and the source electrode. These holes attract free electrons to the interface between the electron channel layer and the barrier layer, thus forming a conduction channel between the source electrode and the drain electrode. The field effect transistor then behaves as a p-FET transistor even though its conduction is provided by electrons.

In a first embodiment of the transistor, the p-type doped semiconductor material layer extends continuously from the source electrode to the drain electrode and the drain electrode is in Schottky contact with the p-type doped semiconductor material layer.

In a second embodiment, the p-type doped semiconductor material layer extends discontinuously from the source electrode to the drain electrode and the drain electrode is in ohmic contact with the p-type doped semiconductor material layer.

In addition to the characteristics just discussed in the preceding paragraphs, the transistor according to the first aspect of the invention may have one or more complementary characteristics from among the following, considered individually or according to any technically possible combination:

the hole channel layer is made of an unintentionally doped semiconductor material;

the electron channel layer and the hole channel layer are formed of a same material, for example unintentionally doped gallium nitride;

the p-type doped semiconductor material layer is a p-type doped gallium nitride layer;

the electron channel layer is comprised of unintentionally doped gallium nitride and the barrier layer is comprised of doped aluminium gallium nitride, preferably unintentionally doped aluminium gallium nitride;

the gate electrode is separated from the p-type doped semiconductor material layer by a dielectric layer;

the p-type doped semiconductor material layer has a concentration of doping impurities of between $1 \cdot 10^{17}$ cm$^{-3}$ and $1 \cdot 10^{18}$ cm$^{-3}$;

the barrier layer is comprised of aluminium gallium nitride and has an aluminium content of between 15% and 25%; and the barrier layer is comprised of aluminium gallium nitride and has a thickness of between 2 nm and 10 nm.

A second aspect of the invention relates to an integrated circuit comprising:

a substrate;

an electron channel layer disposed on the substrate;

a barrier layer disposed on the electron channel layer;

a hole channel layer disposed on the barrier layer;

a p-type doped semiconductor material layer disposed on the hole channel layer;

a first source electrode comprising a first portion in ohmic contact with the electron channel layer and a second portion in ohmic contact with the p-type doped semiconductor material layer;

a first drain electrode in ohmic contact with the electron channel layer;

a first gate electrode disposed facing the p-type doped semiconductor material layer, between the source and drain electrodes;

a second source electrode in ohmic contact with the electron channel layer;

a second drain electrode in ohmic contact with the electron channel layer; and a gate structure disposed between the second source and drain electrodes;

the first source, drain and gate electrodes belonging to a field effect transistor according to the first aspect of the invention and the second source electrode, the second drain electrode and the gate structure belonging to a high electron mobility transistor.

The first drain electrode may be electrically connected to the second drain electrode so as to be subjected to the same electrical potential.

In a preferred embodiment, the gate structure of the high electron mobility transistor comprises a portion of the p-type doped semiconductor material layer and a second gate electrode disposed facing said portion.

BRIEF DESCRIPTION OF THE FIGURES

Other characteristics and advantages of the invention will become apparent from the description given below, by way of indicating and in no way limiting purposes, with reference to the appended figures, among which.

For the sake of clarity, identical or similar elements are marked by identical reference signs throughout the figures.

DETAILED DESCRIPTION

Figure 1:
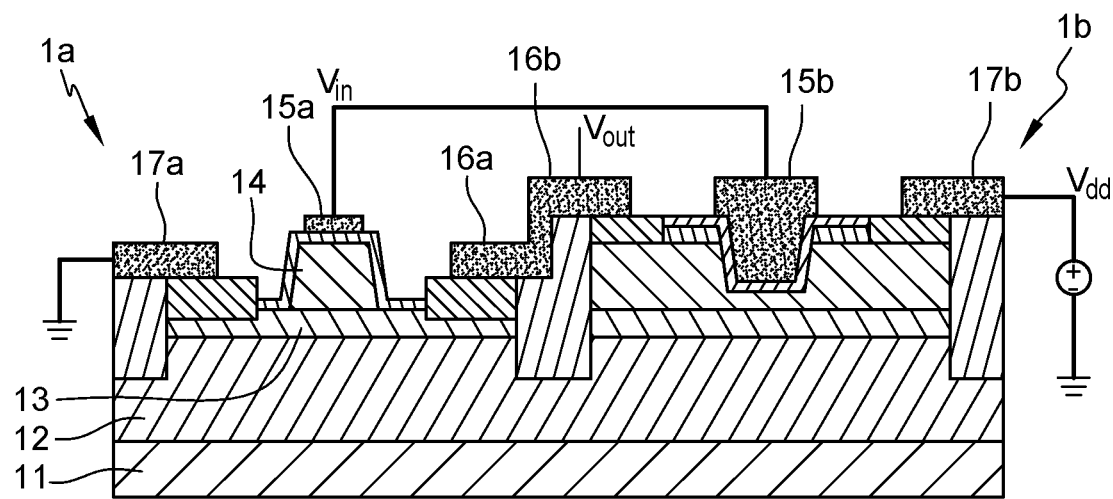
FIG. 1, described previously, is a cross-sectional view of a GaN inverter according to prior art.
Figure 2:
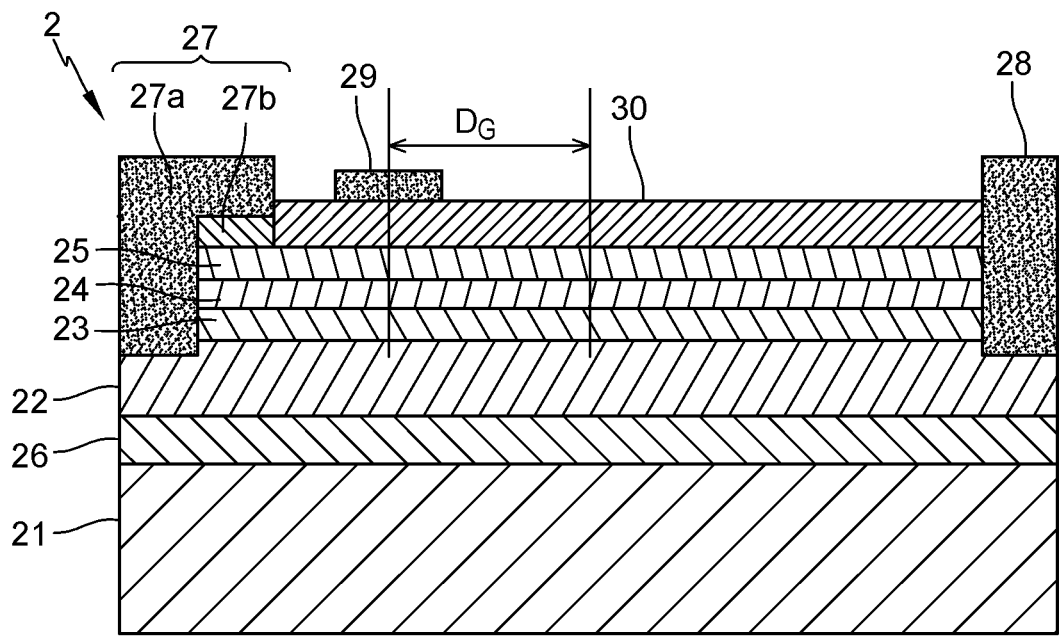
FIG. 2 schematically represents a first embodiment of a field effect transistor according to the first aspect of the invention.

FIG. 2 is a schematic cross-sectional view of a field effect transistor 2 according to a first embodiment. The field effect transistor 2 is an electronic component formed from III-N semiconductor materials. It has advantageous applications in power electronics.

The transistor 2 is similar to a p-FET (type) transistor in that it has a negative threshold voltage $V_T$ and a negative drain-source current $I_{DS}$. However, unlike the p-FET transistor of prior art (whose conduction in the on state is provided by holes), the current of the transistor 2 (in the on state) is due to the transport of electrons. Transistor 2 is therefore an electron current transistor having a p-FET type behaviour (more simply, it will be referred to as an electron current p-FET transistor). Connected to one or more n-FET transistors, it can form logic gates, for example an inverter.

With reference to FIG. 2, the transistor 2 comprises a substrate 21 and a vertical stack of semiconducting layers on the substrate 21. This stack comprises at least:

an electron channel layer 22 disposed on the substrate 21;

a barrier layer 23 disposed on the electron channel layer 22;

a hole channel layer 24 disposed on the barrier layer 23; and a p-type doped semiconductor material layer 25 disposed on the hole channel layer 24 and hereinafter called the p-doped layer.

The substrate 21 is for example of silicon (Si), silicon carbide (SiC), gallium nitride (GaN) or sapphire ($Al_2O_3$). The electron channel layer 22, the barrier layer 23, the hole channel layer 24 and the p-doped layer 25 are semiconducting layers of III-V semiconductor material, preferably based on gallium nitride (GaN) (in other words GaN or a GaN alloy such as AlGaN, InGaN . . . ).

The electron channel layer 22 is the layer in which the conduction channel of the transistor 2 is formed. It is comprised of a first III-N semiconductor material. The barrier layer 23 is comprised of a second III-N semiconductor material having a bandgap greater than that of the first III-N semiconductor material (electron channel layer 22), in order to create a potential barrier.

The discontinuity of the conduction band at the interface between the electron channel layer 22 and the barrier layer 23 forms, under certain bias conditions, a potential well in which the electrons are confined, thus creating a 2-dimensional electron gas (2DEG).

Thus, the transistor 2 comprises a first heterostructure comprising the electron channel layer 22 and the barrier layer 23. The first heterostructure is for example of the GaN/AlGaN type. The electron channel layer 22 is then comprised of gallium nitride, preferably unintentionally doped gallium nitride (UID GaN), while the barrier layer 23 is comprised of aluminium gallium nitride, preferably unintentionally doped aluminium gallium nitride (UID AlGaN). A semiconductor material is considered unintentionally doped when its concentrations of donor type and acceptor type dopants are less than $10^{16}$ cm$^{-3}$ ($N_A < 10^{16}$ cm$^{-3}$ and $N_D < 10^{16}$ cm$^{-3}$). Preferably, the electron channel layer 22 has a thickness of between 20 nm and 500 nm, while the barrier layer 23 has a thickness of between 2 nm and 30 nm. The thickness of a layer is measured in a direction perpendicular to the substrate 21.

The first heterostructure may also comprise an intermediate layer (not illustrated in the figure), disposed between the electron channel layer 22 and the barrier layer 23, to increase the density and mobility of electrons in the 2-dimensional electron gas. Such an intermediate layer, also called a spacer layer, is typically extremely thin (thickness less than or equal to 1 nm) and can be comprised of aluminium nitride (AlN), this material being particularly adapted to the interface between an electron channel layer 22 of GaN and a barrier layer 23 of AlGaN.

The hole channel layer 24 is comprised of a third III-N semiconductor material having a bandgap smaller than that of the second III-N semiconductor material (barrier layer 23). The third III-N semiconductor material (hole channel layer 24) is preferably unintentionally doped. It is advantageously identical to the first III-N semiconductor material (electron channel layer 22), for example unintentionally doped GaN. Preferably, the hole channel layer 24 has a thickness of between 5 nm and 300 nm.

Thus, the transistor 2 comprises a second heterostructure comprising the barrier layer 23 and the hole channel layer 24. The second heterostructure is juxtaposed to the first heterostructure (also referred to as a double heterostructure, here GaN/AlGaN/GaN).

The p-doped layer 25 is preferably comprised of a fourth p-doped III-N semiconductor material. The p-doped layer 25 is for example a p-doped GaN (or p-GaN) layer. It has a concentration of p-type doping impurities which is advantageously between $1·10^{16}$ cm$^{-3}$ and $5·10^{18}$ cm$^{-3}$. The thickness of the p-doped layer 25 can be between 5 nm and 40 nm. The doping impurities in the p-doped layer 25 are for example magnesium ions. The hole channel layer 24 and the p-doped layer 25 are preferably placed side by side, that is, disposed in direct contact.

The p-doped layer 25 is distinct from the hole channel layer 24 in that it has a doping different from the hole channel layer 24 (p-doping versus unintentionally doped).

Still with reference to FIG. 2, the transistor 2 advantageously comprises a semi-insulating buffer layer 26 disposed between the substrate 21 and the electron channel layer 22. This buffer layer 26 limits the lateral and vertical leakage currents in the transistor 2 and improves its (lateral) voltage withstand in the off state. The buffer layer 26 preferably comprises a III-N semiconductor material, such as GaN or AlGaN. This semiconductor material may be doped with impurities, such as carbon atoms. The buffer layer 26 can especially be formed by a single GaN:C layer or by a GaN:C/$Al_xGa_{1-x}N$ bilayer, with x between about 4% and 8%. The thickness of the buffer layer 26 is for example between 1 µm and 15 µm.

In addition to the stack of semiconducting layers, the transistor 2 comprises a source electrode 27, a drain electrode 28 and a gate electrode 29. It may also comprise a dielectric layer 30 which covers the stack of semiconducting layers, and more particularly the p-doped layer 25, between the source electrode 27 and the drain electrode 28.

The source electrode 27 comprises a first portion 27a in ohmic contact with the electron channel layer 22 and a second portion 27b in ohmic contact with the p-doped layer 25. The first and second portions 27a-27b of the source electrode 27 are arranged so as to be subjected to the same electrical potential. They are preferably placed side by side (in other words in direct contact).

The first portion 27a may extend vertically (that is, perpendicularly to the substrate 21) to the electron channel layer 22, as represented in FIG. 2, to the interior of the barrier layer 23 or to the upper face of the barrier layer 23. It is comprised of a metal material or several stacked metal materials. The first portion 27a of the source electrode 27 is comprised, for example, of a two-layer stack comprising an aluminium layer disposed on a titanium layer (the titanium being in contact with the electron channel layer 22 or the barrier layer 23, depending on the depth of the ohmic contact).

The second portion 27b of the source electrode 27 may also be comprised of a metal material or of several stacked metal materials. These materials are advantageously different from those of the first portion 27a. The second portion 27b is for example comprised of a nickel/gold type two-layer stack (the nickel being in contact with the p-doped layer 25) annealed for example under $N_2:O_2$ at 560° C. for 40 minutes. Alternatively, the second portion 27b may be formed of a two-layer stack comprising a metal layer, for example magnesium, disposed on a heavily p-doped III-N semiconductor material layer (p++; concentration between $10^{18}$ cm$^{-3}$ and $10^{20}$ cm$^{-3}$) in order to form a low resistive (ohmic) contact with the p-doped layer 25.

The drain electrode 28 is in ohmic contact with the electron channel layer 22. Advantageously, it is formed of the same metal material or the same stack of metal materials as the first portion 27a of the source electrode 27.

The gate electrode 29 is disposed facing the p-doped layer 25 between the source electrode 27 and the drain electrode 28. It is preferably separated from the p-doped layer 25 by the dielectric layer 30, as represented by FIG. 2. Alternatively, the gate electrode 29 may be in Schottky contact with the p-doped layer 25. The gate electrode 29 may be comprised of a metal material or of several stacked metal materials. It is for example formed of titanium nitride (TiN).

The dielectric layer 30 acts as a passivation layer by neutralising defects on the surface of p-doped layer 25. It may be comprised of a single electrically insulating material, for example silicon dioxide ($SiO_2$), silicon nitride ($Si_3N_4$), aluminium nitride (AlN) or alumina ($Al_2O_3$). Alternatively, the passivation layer may include a plurality of stacked sublayers formed of different insulating materials, typically alternating oxide (for example $SiO_2$) and nitride (for example SiN) sublayers.

Figure 3:
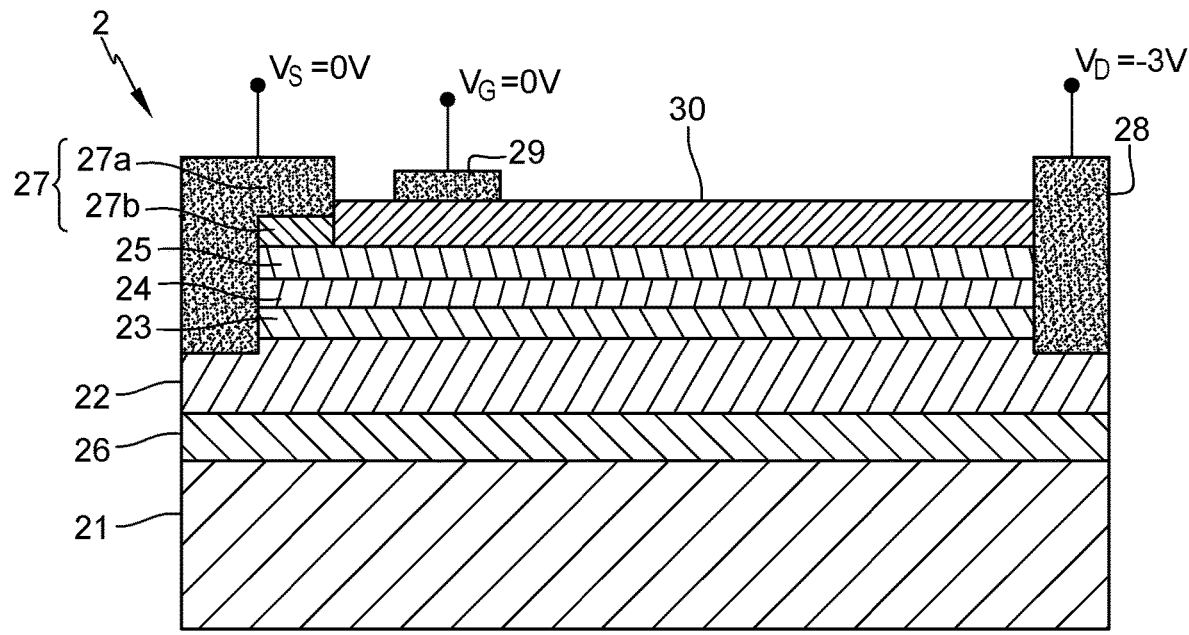
FIG. 3 schematically represents the field effect transistor of FIG. 2 in the off state.
Figure 4:
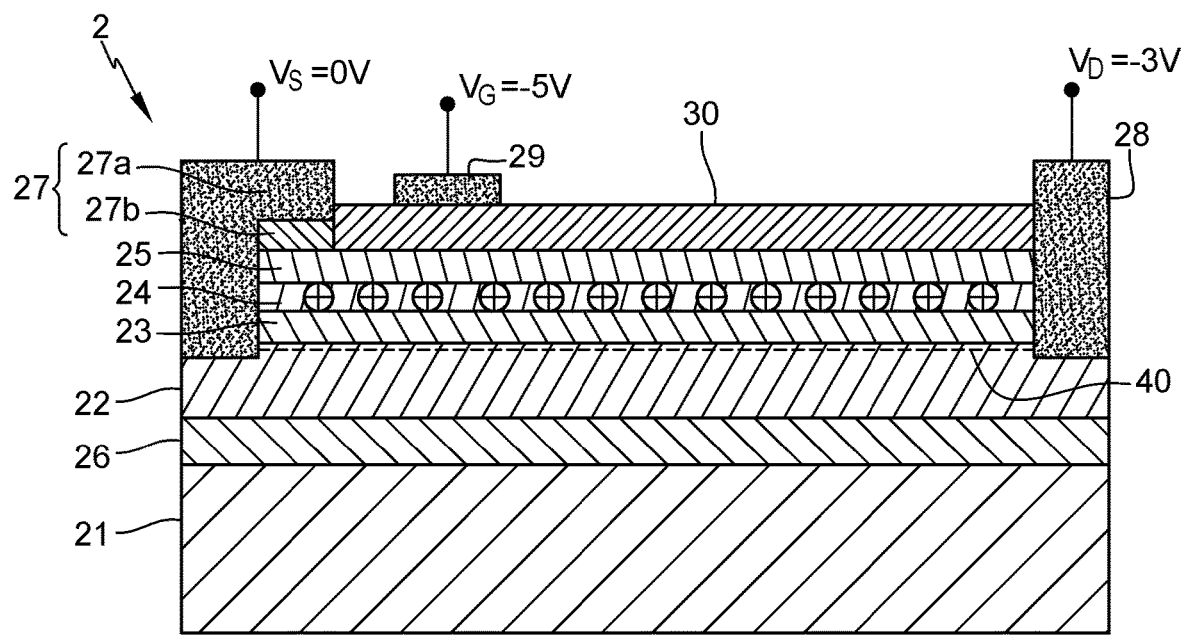
FIG. 4 schematically represents the field effect transistor of FIG. 2 in the on state.

The operation of the transistor 2 will now be described in relation to FIGS. 3 and 4. The electrical potentials of the source electrode 27, the drain electrode 28 and the gate electrode 29 are denoted as $V_S$, $V_D$ and $V_G$ respectively.

When the gate-source voltage $V_{GS}$ is zero, for example when $V_G=V_S=0$ V (see FIG. 3), the p-doped layer 25 depletes the 2-dimensional electron gas located in the electron channel layer 22 in the immediate vicinity of the interface between the electron channel layer 22 and the barrier layer 23 (as in a p-GaN gate HEMT transistor). No (electron) current flows from the drain electrode 28 to the source electrode 27 when a negative drain-source voltage $V_{DS}$ (for example $V_D$=-3 V) is applied. The transistor 2 is in the off state.

On the other hand, when a highly negative gate-source voltage $V_{GS}$ is applied, for example by choosing $V_G$=-5 V and $V_S$=0 V (see FIG. 4), free holes are injected into the hole channel layer 24 by the source electrode 27 through the p-doped layer 25, by means of the ohmic contact between the second portion 27b of the source electrode 27 and the p-doped layer 25. These holes are distributed in the hole channel layer 24 from the source electrode 27 to the drain electrode 28, due to the electric field generated by the negative drain-source voltage $V_{DS}$ (for example $V_D$=-3 V). By electrostatic effect, they attract free electrons to the interface between the electron channel layer 22 and the barrier layer 23, thus reconstituting a conduction channel 40 which electrically connects the source electrode 27 and the drain electrode 28. In FIG. 4, the conduction channel 40 is symbolised by dashed lines in the electron channel layer 22 along the interface between the electron channel layer 22 and the barrier layer 23. An electron current flows in this channel 40 (from the drain electrode 28 to the source electrode 27) under the effect of the electric field generated by the negative drain-source voltage $V_{DS}$. The transistor 2 is in the on state.

The transistor 2 thus behaves as a normally-off type (no current under a zero gate voltage $V_{GS}$) p-FET transistor (negative threshold voltage $V_T$ and negative current $I_{DS}$ under a negative drain-source voltage $V_{DS}$).

Unlike the 2-dimensional electron gas formed by heterojunction between the electron channel layer 22 and the barrier layer 23 (in the absence of the p-doped layer 25), the conduction channel 40 does not have a uniform electron concentration. This is due to a non-uniform distribution of holes in the hole channel layer 24 and of the electric field as a result of the bias of the gate 29.

The mobility of the electrons in the conduction channel 40 is nevertheless much greater than the mobility of the holes in a p-GaN channel layer. The transistor 2 therefore has a much higher current density than the p-FET transistor of prior art. The on state current density of the transistor 2 is of the same order of magnitude as that of a high electron mobility transistor (HEMT), since conduction in these two types of transistor is based on the same type of charge carriers.

FIGS. 5 to 9 represent different current-voltage characteristics of an example transistor according to FIG. 2, obtained by means of TCAD electrical simulations. In this example, the transistor 2 comprises a 3 μm-thick GaN UID electron channel layer 22, an AlGaN UID barrier layer 23, a 10 nm-thick GaN UID hole channel layer 24 and a 5 nm-thick p-GaN p-doped layer 25. The concentration of doping impurities (magnesium ions) in the p-doped layer 25 is equal to $3.10^{17}$ $cm^{-3}$, except in the simulation in FIG. 5 where this parameter varies. The aluminium content in the AlGaN barrier layer 23 is equal to 20%, except in the simulation in FIG. 6 where this parameter varies. The thickness of the AlGaN barrier layer 23 is equal to 5 nm, except in the simulation of FIG. 7 where this parameter varies.

Figure 5:
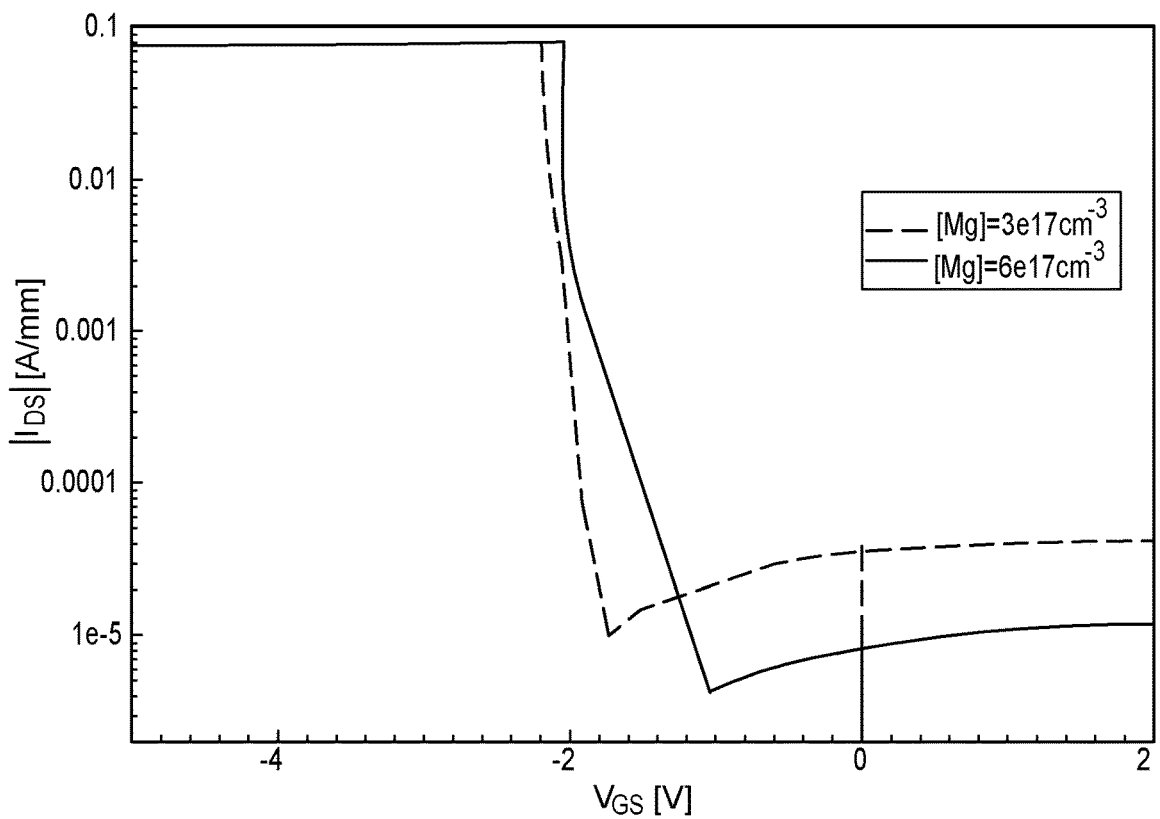
FIG. 5 shows $I_{DS}$-$V_{GS}$ characteristics of an example transistor according to FIG. 2, these characteristics corresponding to different concentrations of dopants in a p-doped GaN layer.

FIG. 5 represents (in logarithmic scale) the absolute value of the drain-source current $I_{DS}$ (denoted as $|I_{DS}|$) as a function of the gate-source voltage $V_{GS}$, for several values of the concentration of doping impurities (magnesium ions) in the p-doped layer 25. This figure shows that the doping level of the p-doped layer 25 influences the off state current (the leakage current). The higher the concentration of doping impurities, the lower the off state current. This is due to greater depletion of the 2-dimensional electron gas. On the other hand, the doping level does not influence the on state current, because the free holes injected into the hole channel layer 24 do not come from the p-doped layer 25. A concentration of doping impurities of between $1·10^{17}$ $cm^{-3}$ and $1·10^{18}$ $cm^{-3}$ is a good compromise between leakage current and threshold voltage.

It may also be noted that, in this example, the threshold voltage $V_T$ of the transistor is about -2 V and that the on state current density is in the order of 0.1 A/mm.

Figure 6:
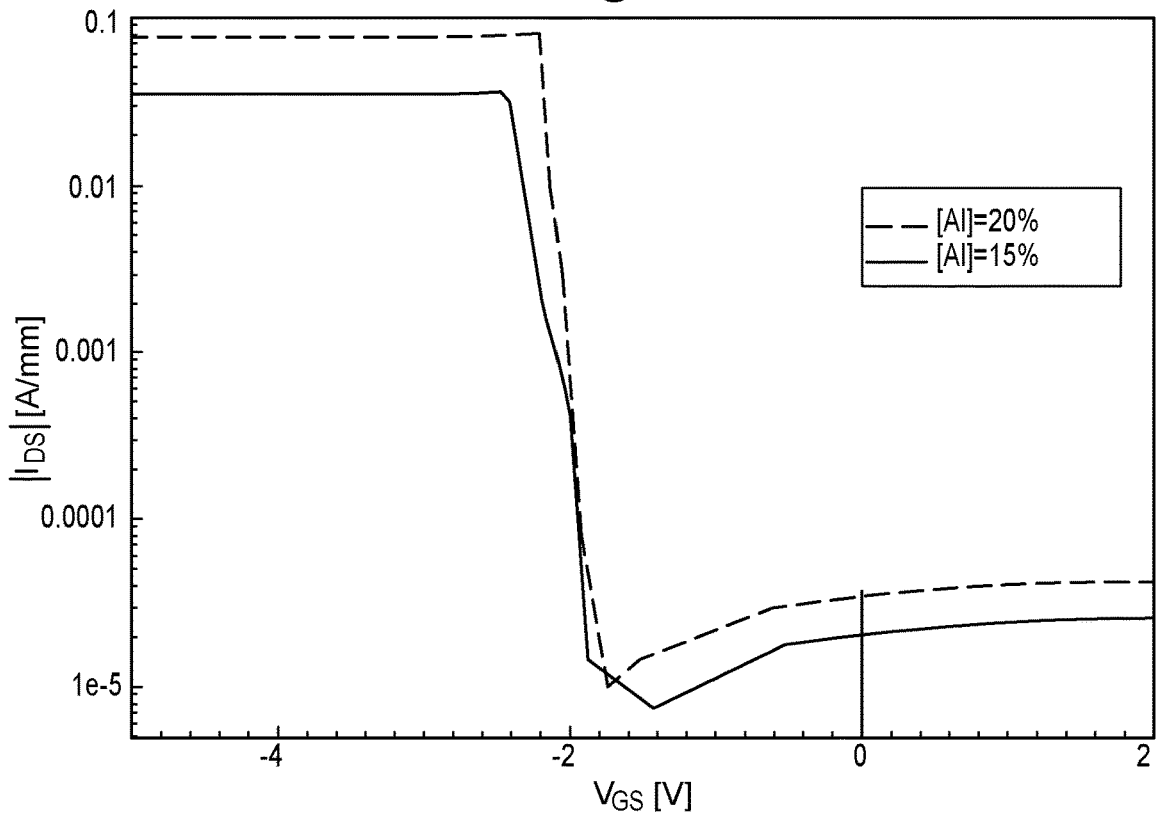
FIG. 6 shows $I_{DS}$-$V_{GS}$ characteristics of an example transistor according to FIG. 2, these characteristics corresponding to different aluminium percentages in an AlGaN barrier layer.

FIG. 6 represents the drain-source current $|I_{DS}|$ (still in logarithmic scale) as a function of the gate-source voltage $V_{GS}$, for several values of the aluminium content in the AlGaN barrier layer 23. This figure shows that the on state current of the transistor increases with the aluminium content in the barrier layer 23. Indeed, the higher the aluminium content, the higher the level of positive bias in the barrier layer 23 at the interface with the electron channel layer 22, and therefore the more electrons the conduction channel 40 contains. The leakage current also increases, as the 2-dimensional electron gas is less depleted in the off state. An aluminium content of between 15% and 25% is a good compromise between on state current and off state current.

Figure 7:
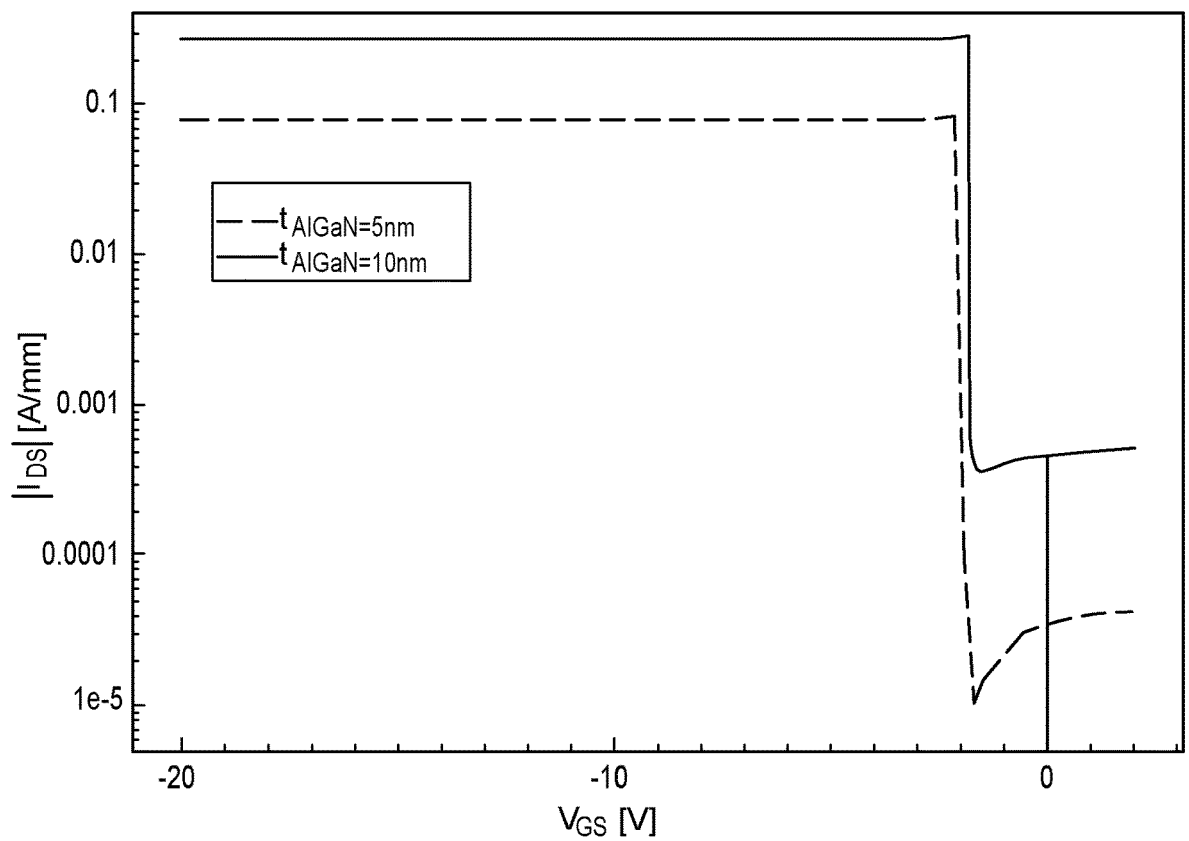
FIG. 7 shows $I_{DS}$-$V_{GS}$ characteristics of an example transistor according to FIG. 2, these characteristics corresponding to different thicknesses of an AlGaN barrier layer.

FIG. 7 represents the drain-source current $|I_{DS}|$ (still in logarithmic scale) as a function of the gate-source voltage $V_{GS}$, for several values of thickness of the AlGaN barrier layer 23 (denoted as $t_{AlGaN}$). This figure shows that the on state current and off state current of the transistor increase with the thickness of the barrier layer 23, as it induces a variation in its electric field linked to the bias charges. A thickness of between 2 nm and 10 nm is a good compromise between on state current and off state current.

Figure 8:
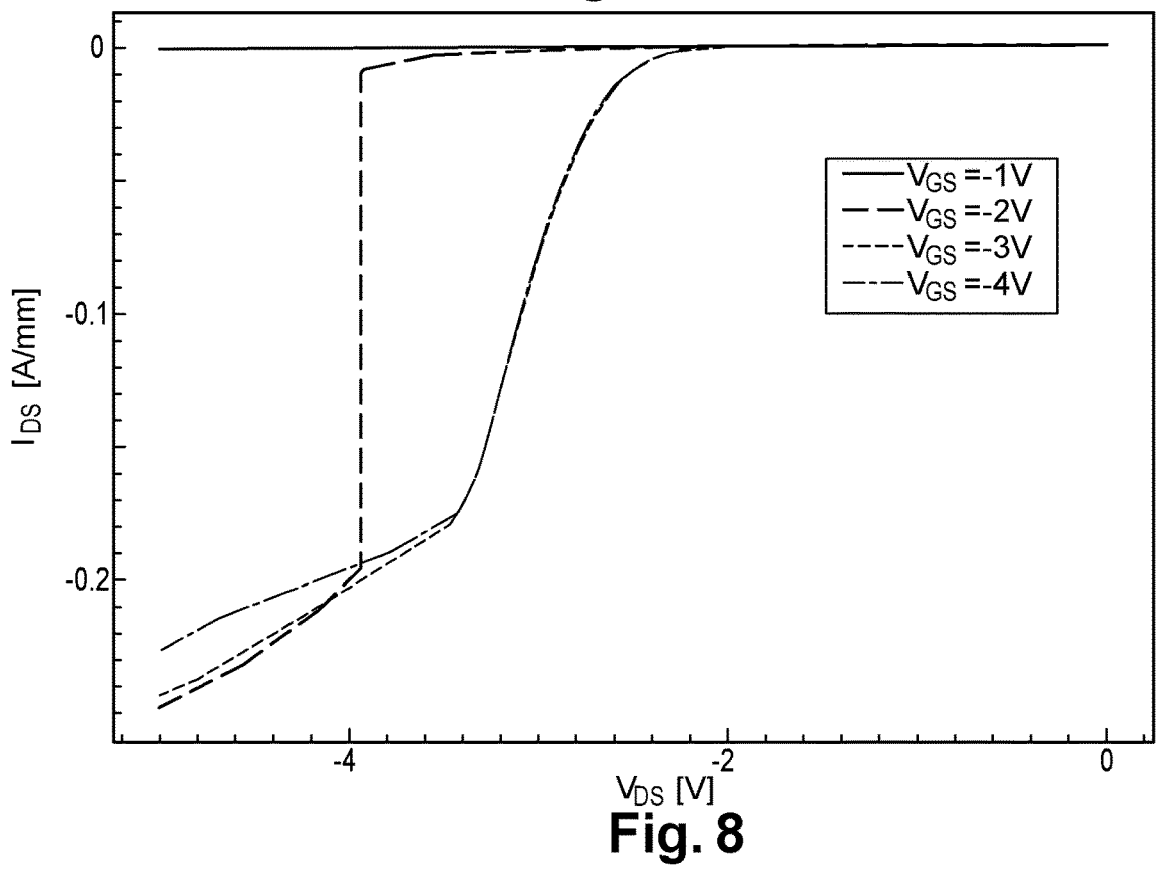
FIG. 8 shows $I_{DS}$-$V_{DS}$ characteristics of an example transistor according to FIG. 2, these characteristics corresponding to different gate voltages $V_{GS}$.

FIG. 8 represents the drain-source current $I_{DS}$ (in linear scale) as a function of the drain-source voltage $V_{DS}$, for several values of the gate-source voltage $V_{GS}$. This figure shows a threshold effect in the increase of the drain-source current $|I_{DS}|$ ($I_{DS}$ in absolute value) when the drain-source voltage $|V_{DS}|$ increases. This threshold effect is characteristic of the Schottky diode formed by the second portion 27b of the source electrode 27, the p-doped layer 25 and the drain electrode 28.

In other words, a threshold value of drain-source voltage $|V_{DS}|$ has to be exceeded in order to be able to inject holes into the hole channel layer 24 and create (by electrostatic effect) the conduction channel 40.

FIG. 8 also shows that this threshold value of drain-source voltage $|V_{DS}|$ decreases when the gate-source voltage $|V_{GS}|$ increases, down to about $|V_{GS}|=3$ V ($V_{GS}=-3$ V).

Figure 9:
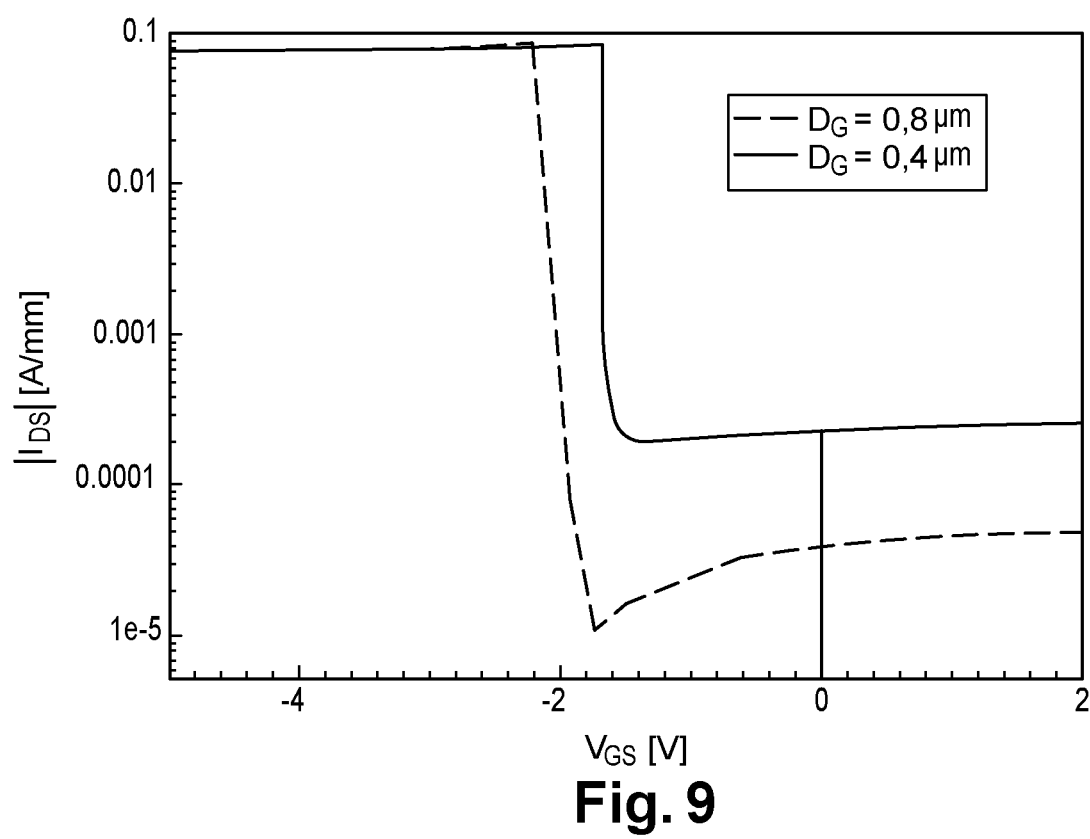
FIG. 9 shows $I_{DS}$-$V_{GS}$ characteristics of an example transistor according to FIG. 2, these characteristics corresponding to different positions of the gate electrode.

FIG. 9 represents the drain-source current $|I_{DS}|$ (still in logarithmic scale) as a function of the gate-source voltage $V_{GS}$, for several values of the position $D_G$ of the gate electrode 29. The position $D_G$ of the gate electrode 29 is the distance separating the centre of the gate electrode 29 from the centre of the layers 23 to 25 (see FIG. 2). The position $D_G$ of the gate modifies the distribution of the electric field in the structure and influences the threshold voltage $V_T$ as well as the off state current. A position $D_G$ of between 0.4 μm and 0.8 μm is a good compromise between off state current and threshold voltage.

In the first embodiment illustrated by FIG. 2, the p-doped layer 25 extends continuously from the source electrode 27 to the drain electrode 28. The 2-dimensional electron gas is then completely depleted, which minimises the leakage current of the transistor 2 in the off state. The drain electrode 28 is in Schottky contact with the p-doped layer 25, in order to avoid a hole current in the p-doped layer 25.

Figure 10:
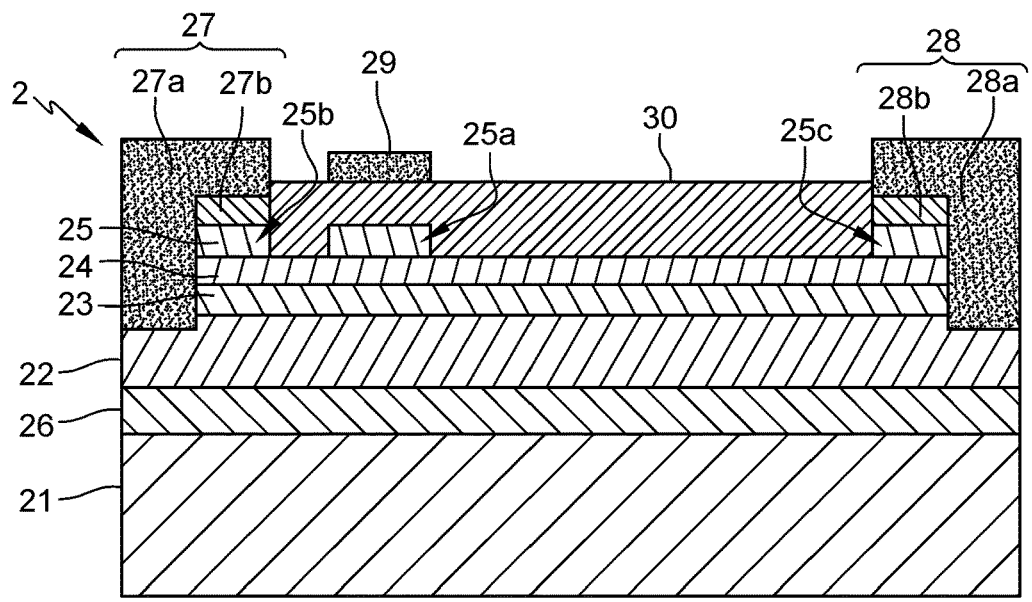
FIG. 10 schematically represents a second embodiment of the field effect transistor according to the first aspect of the invention.

FIG. 10 represents a second embodiment of the electron current p-FET transistor 2. This second embodiment differs from the first embodiment (FIG. 2) in that the p-doped layer 25 extends discontinuously from the source electrode 27 to the drain electrode 28. More particularly, the p-doped layer 25 comprises several disjoint portions, a first portion 25a located facing, or in other words in vertical alignment with, the gate electrode 29, a second portion 25b located in ohmic contact with the second portion 27b of the source electrode 27 and a third portion 25c in ohmic contact with the drain electrode 28.

The ohmic contacts (between the source electrode 27 and the p-doped layer 25, on the one hand, and between the drain electrode 28 and the p-doped layer 25, on the other hand) make it possible to generate, in the on state, a hole current in the hole channel layer 24, which is added to the electron current in the conduction channel 40. The transistor 2 according to this second embodiment therefore benefits from a slightly higher current density than the transistor 2 according to the first embodiment (the hole current is much lower than the electron current, because of the lower mobility of the holes).

The drain electrode 28 can thus include, like the source electrode 27, a first portion 28a in ohmic contact with the electron channel layer 22 and a second portion 28b in ohmic contact with the p-doped layer 25. The first portion 27a of the source electron 27 and the first portion 28a of the drain electron 28 are preferably formed of the same metal material or materials. The second portion 27b of the source electron 27 and the second portion 28b of the drain electron 28 are preferably formed of the same material or materials (metal and/or heavily doped III-V semiconductor).

An example method for manufacturing the electron current p-FET transistor 2 will now be described in relation to FIGS. 11A-11E. These figures schematically represent steps S1 to S5 for manufacturing the transistor 2 of FIG. 2.

Figure 11A:
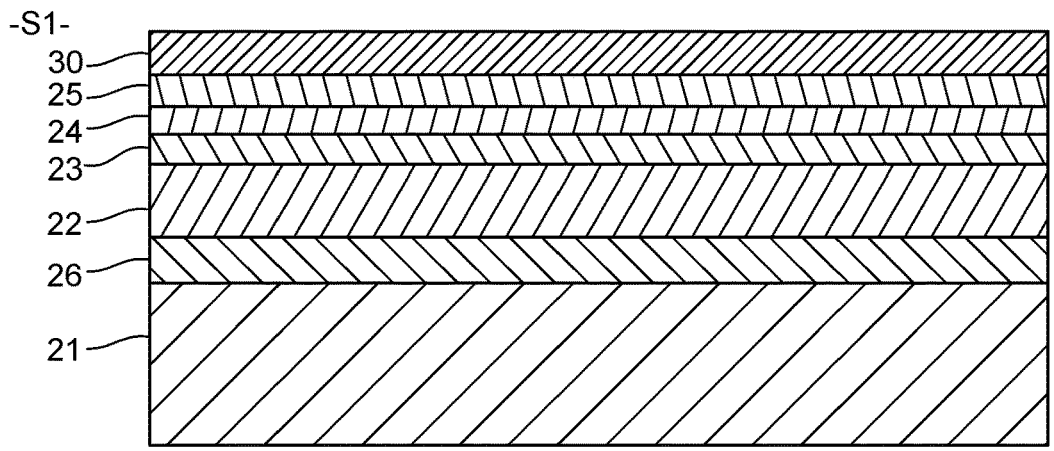
FIGS. 11A to 11E represent steps in a method for manufacturing the field effect transistor according to FIG. 2.

Step S1 illustrated by FIG. 11A comprises forming the stack of semiconducting layers on the substrate 21. The stack is preferably formed from the substrate 21 by successively epitaxially growing the buffer layer 26 (if required), the electron channel layer 22, the barrier layer 23, the hole channel layer 24 and the p-doped layer 25.

Step S1 may furthermore comprise depositing the dielectric layer 30, or passivation layer, onto the p-doped layer 25.

The passivation layer 30 preferably covers the entire upper face of the p-doped layer 25. Depositing the passivation layer 30 and growing the semiconducting layers are preferably operations performed in the same equipment.

Figure 11B:
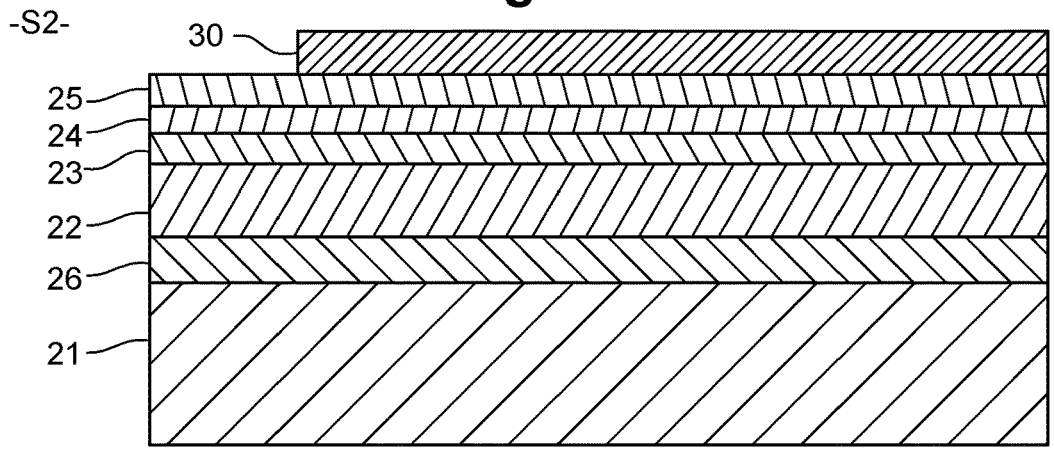

Step S2 in FIG. 11B consists in etching a portion of the passivation layer 30 so as to be able to access the p-doped layer 25 and subsequently form the second portion 27b of the source electrode 27. In other words, a portion of the p-doped layer 25 is uncovered. This first etching step S2, called the step of opening the ohmic contact on the p-doped layer 25, is selective with respect to the p-doped layer 25.

Figure 11C:
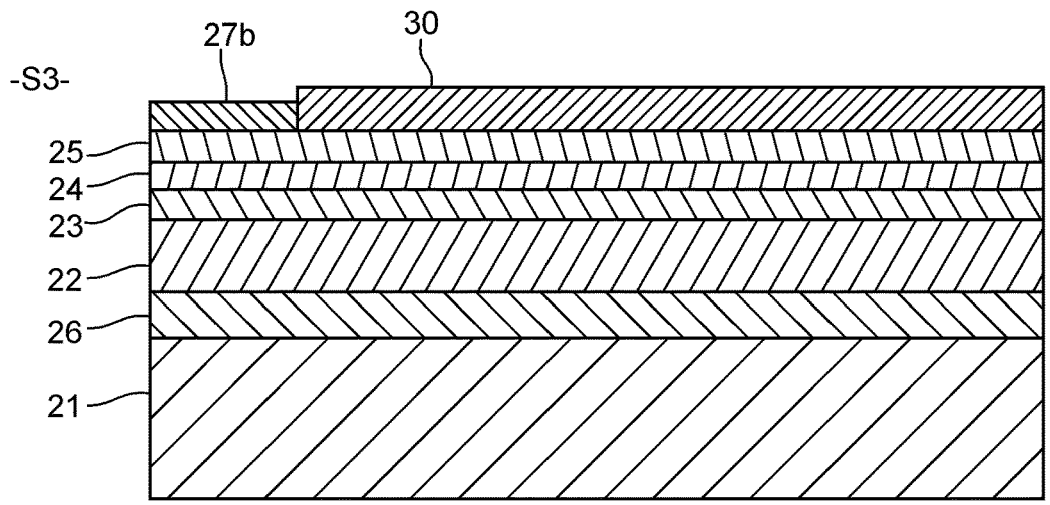

Step S3 in FIG. 11C consists in forming the second portion 27b of the source electrode 27, in ohmic contact with the p-doped layer 25. As a reminder, the second portion 27b may comprise a so-called contact layer of a heavily p-doped (p++) III-N semiconductor material or a metal material layer, in direct contact with the p-doped layer 25.

In a first embodiment of this step S3, forming the second portion 27b comprises depositing a first metal layer onto the uncovered portion of the p-doped layer 25 and onto the passivation layer 30, and then etching the portion of the first metal layer disposed on the passivation layer 30. The first metal layer may comprise several stacked sub-layers formed of different metal materials (for example Ni/Au).

In a second embodiment, forming the second portion 27b comprises (epitaxially) growing a p++-doped contact layer only on the uncovered portion of the p-doped layer 25 (the passivation layer 30 preventing growth otherwise).

In an alternative embodiment of the manufacturing method, (epitaxially) growing the p++-doped contact layer is performed in step S1 of forming the stack of semiconducting layers, after growing the p-doped layer 25 and before depositing the passivation layer 30. The p++-doped contact layer then completely covers the p-doped layer 25. It is then etched to delimit the second portion 27b of the source electrode 27. And then, the passivation layer 30 is formed on the p-doped layer 25 where the p++-doped contact layer has been etched.

Figure 11D:
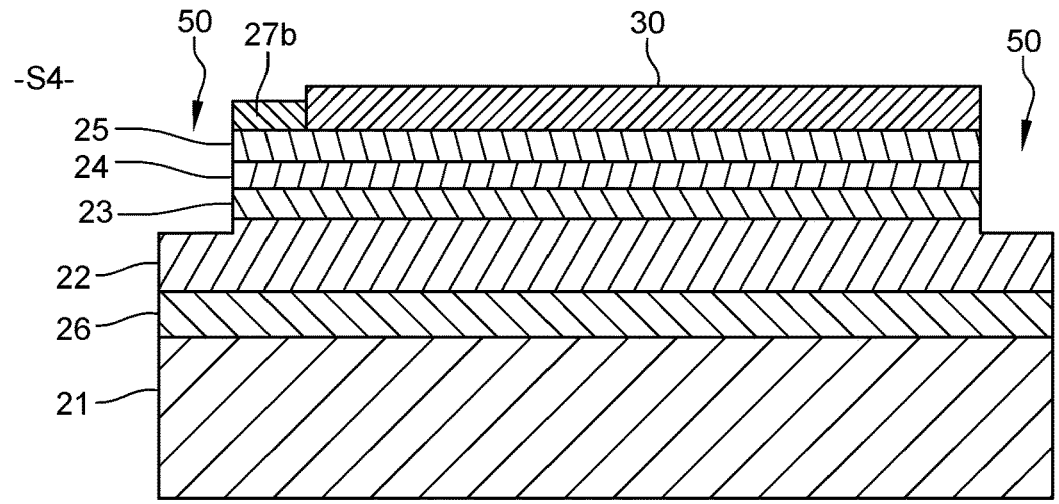

With reference to FIG. 11D, the manufacturing method then comprises a step S4 during which two cavities 50 intended to make the drain and source electrodes are etched into the stack of layers. This step S4 is called the step of opening the source and drain contacts. Etching may extend to the upper face of the barrier layer 23 (therefore through the passivation layer 30 or the p++-doped contact layer, the p-doped layer 25 and the hole channel layer 24), to the interior of the barrier layer 23 (the barrier layer 23 is furthermore etched over part of its thickness) or, as represented by FIG. 11D, to the interior of the electron channel layer 22 (the barrier layer 23 is etched over its entire thickness and the electron channel layer 22 is etched over part of its thickness).

Figure 11E:
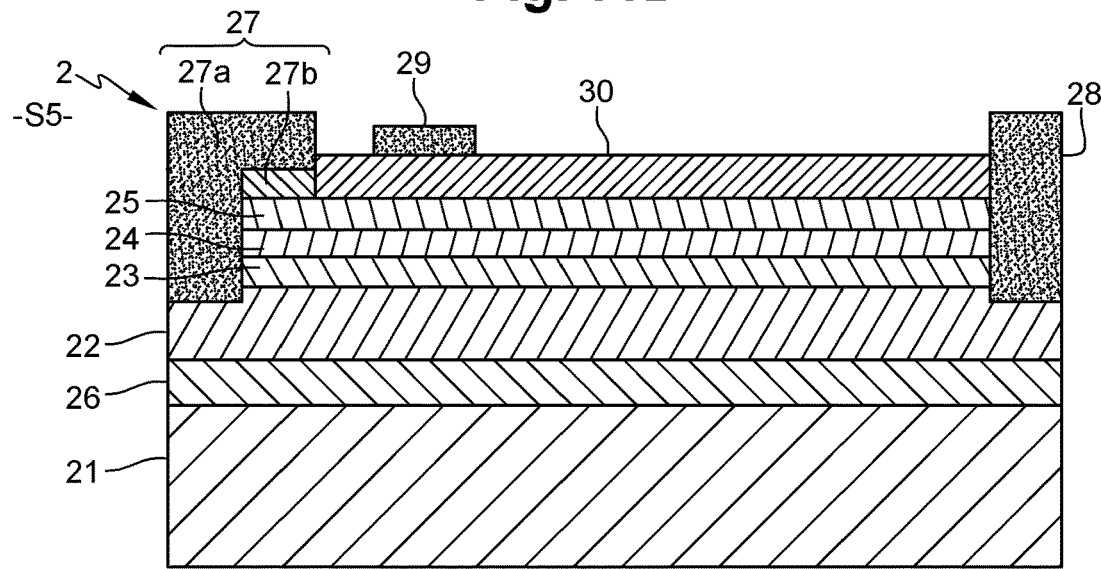

Finally, step S5 in FIG. 11E consists in forming the first portion 27a of the source electrode 27 and the drain electrode 28 in the cavities 50, as well as the gate electrode 29 on the passivation layer 30, facing the p-doped layer 25. The first portion 27a of the source electrode 27 is formed so as to be in contact with the second portion 27b.

Advantageously, the first portion 27a of the source electrode 27 and the drain electrode 28 are formed simultaneously, by depositing and etching a second metal layer. Like the first metal layer, the second metal layer may comprise several stacked sub-layers formed of different metal materials. The second metal layer is preferably deposited onto the entire surface of the substrate ("full plate deposition"), in other words at the bottom and against the side walls of the cavities 50, onto the second portion 27b of the source electrode 27 and onto the passivation layer 30. And then, the portion of the second metal layer disposed on the passivation layer 30 is etched (selectively with respect to the passivation layer 30).

The gate electrode 29 may also be formed by depositing and etching a third metal layer (said third metal layer may comprise several sub-layers), before or after the first portion 27a of the source electrode 27 and the drain electrode 28.

To manufacture the transistor 2 of FIG. 10, the step S1 of forming the stack may furthermore comprise an operation of etching the p-doped layer 25, selectively with respect to the hole channel layer 24. This etching operation is preferably performed before the operation of depositing the passivation layer 30, such that the latter also covers the uncovered part of the hole channel layer 24. Because of this selective etching step, the transistor 2 of FIG. 10 is more difficult to make than the transistor 2 of FIG. 2.

The structure of the electron current p-FET transistor 2 is remarkable in that it is very close to that of a conventionally designed HEMT transistor, and more particularly a p-GaN gate HEMT transistor. It therefore becomes easy to integrate an electron current p-FET transistor 2 and a HEMT type n-FET transistor on a same substrate.

Figure 12:
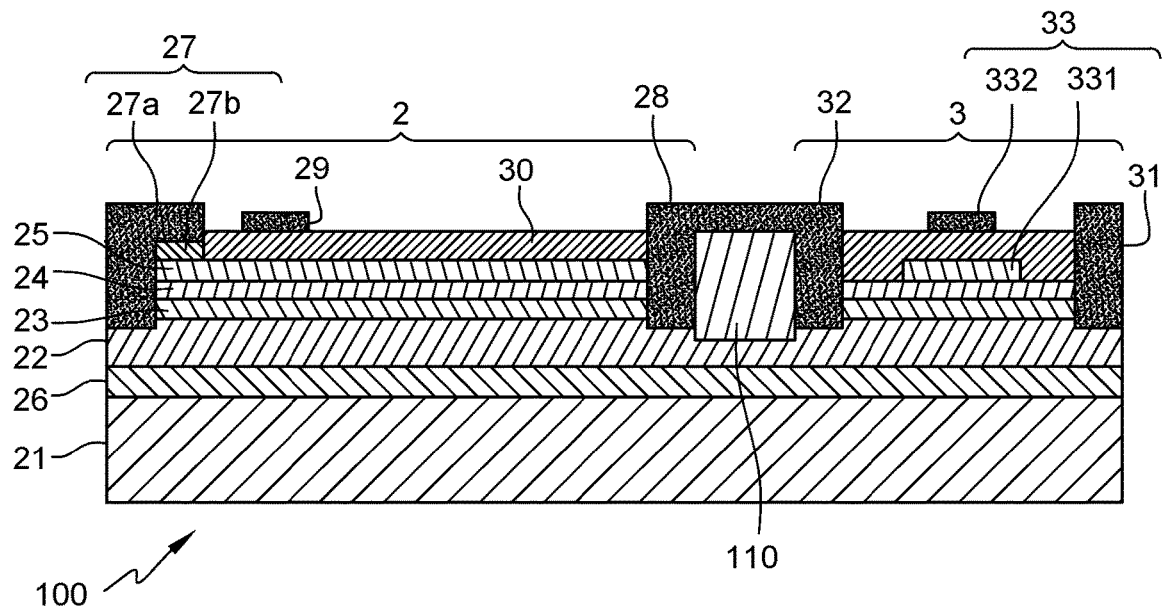
FIG. 12 schematically represents a preferred embodiment of an integrated circuit according to the second aspect of the invention.

FIG. 12 represents a preferred embodiment of an integrated circuit 100 comprising an electron current p-FET transistor 2 and a HEMT transistor 3.

This integrated circuit 100 comprises the substrate 21 and the stack of semiconducting layers previously described in relation to FIG. 2. A first part of the stack is dedicated to the formation of the electron current p-FET transistor 2 and a second part of the stack is dedicated to the formation of the HEMT transistor 3. An electrical insulation trench 110 electrically insulates the part of the stack dedicated to the electron current p-FET transistor 2 and that dedicated to the HEMT transistor 3. The electrical insulation trench 110 extends at least through the p-doped layer 25, the hole channel layer 24, the barrier layer 23 and part of the electron channel layer 22 (so as to electrically insulate the conduction channel 40 of the p-FET transistor 2 and the 2DEG of the HEMT transistor 3).

In addition to the second part of the stack, the HEMT transistor 3 comprises:
a source electrode 31 in ohmic contact with the electron channel layer 22;
a drain electrode 32 in ohmic contact with the electron channel layer 22; and
a gate structure 33 disposed between the source and drain electrodes 31-32.

The drain electrode 28 of the p-FET transistor 2 can be electrically connected to the drain electrode 32 of the HEMT transistor 3 so as to be subjected to the same electrical potential. The two transistors are then connected in series, forming the base of an inverter.

In this preferred embodiment, the gate structure 33 of the HEMT transistor 3 comprises a portion 331 of the p-doped layer 25, for example of p-GaN, and a gate electrode 332 disposed facing said portion 331. Thus, the gate structure 33 is a p-GaN type gate structure.

The portion 331 of the p-doped layer 25 is separated from the source electrode 31 and the drain electrode 32 of the HEMT transistor 3 by a portion of the passivation layer 30. The gate electrode 332 can be separated from the portion 331 of the p-doped layer 25 by the passivation layer 30, as illustrated by FIG. 12, or on the contrary be placed side by side with said portion 331.

Figure 13:
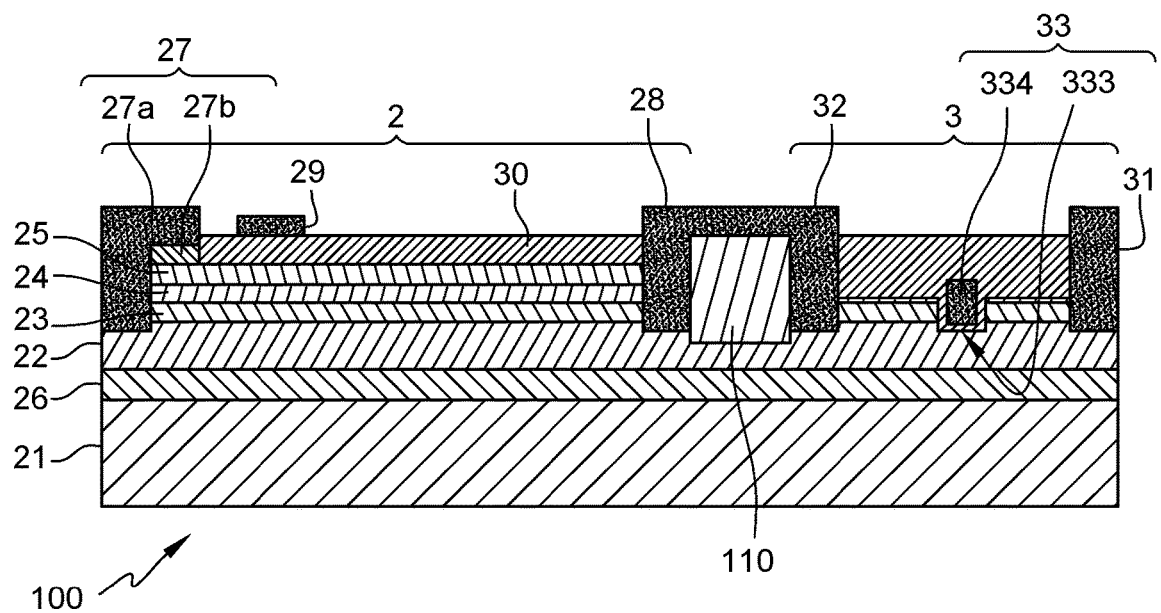
FIG. 13 schematically represents an alternative embodiment of the integrated circuit according to the second aspect of the invention.

In an alternative embodiment of the integrated circuit 100 illustrated by FIG. 13, the HEMT transistor 3 comprises an MOS type gate structure 33, that is, a gate structure 33 comprising a gate dielectric layer 333 (for example formed of the same dielectric material as the passivation layer 30) and a gate electrode 334 (typically of metal). The gate electrode 334 is separated from the electron channel layer 22 and the barrier layer 23 by the gate dielectric layer 333. The gate structure 33 is called buried, because in this alternative embodiment it extends through the barrier layer 23 to the electron channel layer 22 (to "cut" the 2DEG in two). The p-doped layer 25 and at least part of the hole channel layer 24 have advantageously been removed in the second part of the stack dedicated to the HEMT transistor 3. The electron current p-FET transistor 2 is identical to that represented by FIGS. 2 and 12.

Naturally, all these embodiments of the integrated circuit 100 are compatible with the electron current p-FET transistor 2 illustrated in FIG. 10. The operation of selectively etching the p-doped layer 25 is then advantageously performed for both transistors simultaneously.

The invention claimed is:

1. A field effect transistor comprising:
a substrate;
an electron channel layer disposed on the substrate;
a barrier layer disposed on the electron channel layer;
a hole channel layer disposed on the barrier layer;
a p-type doped semiconductor material layer disposed on the hole channel layer;
a source electrode comprising a first portion in ohmic contact with the electron channel layer and a second portion in ohmic contact with the p-type doped semiconductor material layer;
a drain electrode in ohmic contact with the electron channel layer, and
a gate electrode disposed facing the p-type doped semiconductor material layer, between the source and drain electrodes.

2. The field effect transistor according to claim 1, wherein the p-type doped semiconductor material layer extends continuously from the source electrode to the drain electrode and wherein the drain electrode is in Schottky contact with the p-type doped semiconductor material layer.

3. The field effect transistor according to claim 1, wherein the p-type doped semiconductor material layer extends discontinuously from the source electrode to the drain electrode and wherein the drain electrode is in ohmic contact with the p-type doped semiconductor material layer.

4. The field effect transistor according to claim 1, wherein the electron channel layer and the hole channel layer are formed of a same material.

5. The field effect transistor according to claim 1, wherein the p-type doped semiconductor material layer is a p-type doped gallium nitride layer.

6. The field effect transistor according to claim 1, wherein the electron channel layer is comprised of unintentionally doped gallium nitride and wherein the barrier layer is comprised of aluminium gallium nitride.

7. The field effect transistor according to claim 1, wherein the gate electrode is separated from the p-type doped semiconductor material layer by a dielectric layer.

8. The field effect transistor according to claim 1, wherein the p-type doped semiconductor material layer has a concentration of doping impurities of between $1 \times 10^{17}$ cm$^{-3}$ and $1 \times 10^{18}$ cm$^{-3}$.

9. The field effect transistor according to claim 1, wherein the barrier layer is comprised of aluminium gallium nitride and has an aluminium content of between 15% and 25%.

10. The field effect transistor according to claim 1, wherein the barrier layer is comprised of aluminium gallium nitride and has a thickness of between 2 nm and 10 nm.

11. An integrated circuit comprising:
a substrate;
an electron channel layer disposed on the substrate;
a barrier layer disposed on the electron channel layer;
a hole channel layer disposed on the barrier layer;
a p-type doped semiconductor material layer disposed on the hole channel layer;
a first source electrode comprising a first portion in ohmic contact with the electron channel layer and a second portion in ohmic contact with the p-type doped semiconductor material layer;
a first drain electrode in ohmic contact with the electron channel layer;
a first gate electrode disposed facing the p-type doped semiconductor material layer, between the source and drain electrodes;
a second source electrode in ohmic contact with the electron channel layer;
a second drain electrode in ohmic contact with the electron channel layer, and
a gate structure disposed between the second source and drain electrodes,
wherein the first source, drain and gate electrodes belong to a field effect transistor according to claim 1 and wherein the second source electrode, the second drain electrode and the gate structure belong to a high electron mobility transistor.

12. The integrated circuit according to claim 11, wherein the first drain electrode is electrically connected to the second drain electrode so as to be subjected to a same electrical potential.

13. The integrated circuit according to claim 11, wherein the gate structure of the high electron mobility transistor comprises a portion of the p-type doped semiconductor material layer and a second gate electrode disposed facing said portion.

14. The field effect transistor according to claim 4, wherein the same material is unintentionally doped gallium nitride.

15. The field effect transistor according to claim 6, wherein the barrier layer is comprised of unintentionally doped aluminium gallium nitride.

* * * * *